(12) United States Patent
Zhong

(10) Patent No.: US 11,609,271 B2
(45) Date of Patent: Mar. 21, 2023

(54) CLOCK SELF-TESTING METHOD AND ASSOCIATED CIRCUIT

(71) Applicant: Chengdu Monolithic Power Systems Co., Ltd., Chengdu (CN)

(72) Inventor: Changxian Zhong, Chengdu (CN)

(73) Assignee: Chengdu Monolithic Power Systems Co., Ltd., Chengdu (CN)

(*) Notice: Subject to any disclaimer, the term of this patent is extended or adjusted under 35 U.S.C. 154(b) by 0 days.

(21) Appl. No.: 17/507,419

(22) Filed: Oct. 21, 2021

(65) Prior Publication Data

US 2022/0146576 A1   May 12, 2022

(30) Foreign Application Priority Data

Nov. 12, 2020   (CN) .......................... 202011265341.3

(51) Int. Cl.
*G01R 31/28*   (2006.01)
*G01R 31/3185*   (2006.01)

(52) U.S. Cl.
CPC .......................... *G01R 31/318552* (2013.01)

(58) Field of Classification Search
CPC .... G01R 31/318552; G01R 31/318554; G01R 31/318566; G01R 31/318569; G01R 31/3187; G01R 31/31922
See application file for complete search history.

(56) References Cited

U.S. PATENT DOCUMENTS

| | | | |
|---|---|---|---|
| 7,168,020 B2* | 1/2007 | Chen | G01R 31/31727 714/724 |
| 2010/0171528 A1* | 7/2010 | Guillot | G06F 1/24 327/20 |
| 2022/0091950 A1* | 3/2022 | Durga | G01R 31/31724 |
| 2022/0358272 A1* | 11/2022 | Ouyang | G06F 1/14 |

* cited by examiner

*Primary Examiner* — Christine T. Tu
(74) *Attorney, Agent, or Firm* — Perkins Coie LLP

(57) ABSTRACT

A clock self-testing method and circuit. The clock self-testing method includes introducing a first clock signal and a second clock signal, counting cycles of the first clock signal and the second clock signal respectively beginning at the same moment, and if one of the number of cycles of the first clock signal being counted and the number of cycles of the second clock signal being counted is equal to N, determining whether the remained number of cycles is in a count range from M to N. If the remained number of cycles is out of the count range from M to N, the first clock signal and the second clock signal have errors.

7 Claims, 5 Drawing Sheets

CLOCK SELF-TESTING METHOD AND ASSOCIATED CIRCUIT

CROSS-REFERENCE TO RELATED APPLICATION

This application claims the benefit of CN application No. 202011265341.3, filed on Nov. 12, 2020, and incorporated herein by reference.

TECHNICAL FIELD

The present invention generally refers to electrical circuit, and more particularly but not exclusively refers to clock signal testing method and associated circuit.

BACKGROUND

In recent years, with the rapid development of computer technology and microelectronics technology, the complexity of chip is getting higher. Generally, the designed chip may need to be verified whether to meet expected requirements by itself during design process. Especially in automotive electronics applications, in order to ensure the stability of electronic systems of the chip, it is necessary to establish an internal self-test system to test the accuracy of the relevant modules. In many applications, a clock signal is indispensable to control all synchronous logic operations. Therefore, the accuracy of the clock signal should be verified.

FIG. 1 schematically illustrates a conventional analog clock self-testing circuit 50. The analog clock self-testing 50 converts a count value of cycles of the clock signal CLOCK into a voltage signal, then compares the voltage signal with a reference voltage signal Vref which is indicative of a reference count value of the clock signal CLOCK to determine whether the clock signal CLOCK is accurate. However, in the analog clock self-testing circuit 50, the self-testing result is determined by many factors, such as accuracy of the current source, offset of the comparator, etc., which themselves need to be further adjusted. Furthermore, a delay resulting from charging of the capacitor also affects the accuracy of the self-testing result of the clock signal CLOCK.

Therefore, it is desired to propose an efficient clock self-testing method and circuit for clock signals.

SUMMARY

Embodiments of the present invention are directed to a clock self-testing method comprising four steps. Step 1 is introducing a first clock signal and a second clock signal, wherein frequency of the first clock signal is the same as frequency of the second clock signal. Step 2 is counting cycles of the first clock signal and the second clock signal respectively beginning at the same moment. Step 3 is determining whether one of a first cycle number and a second cycle number is equal to N, wherein the first cycle number is indicative of the number of cycles of the first clock signal being counted, and the second cycle number is indicative of the number of cycles of the second clock signal being counted. Step 4 is if one of the first cycle number and the second cycle number is equal to N, determining whether the remained one of the first cycle number and the second cycle number is in a count range from M to N, wherein M and N are integers more than 1, and wherein N is larger than M.

Embodiments of the present invention are directed to a clock self-testing circuit, comprising a first clock signal, a second clock signal, a first counter, a second counter and a digital comparing circuit. Frequency of the first clock signal is the same as frequency of the second clock signal. The first counter is configured to receive the first clock signal, and further configured to count the first clock signal to generate a first counting signal and a second counting signal, wherein the first counting signal is indicative of a predetermined minimum cycle number of the first clock signal being counted, and wherein the second counting signal is indicative of a predetermined maximum cycle number of the first clock signal being counted. The second counter is configured to receive the second clock signal to generate a third counting signal and a fourth counting signal, wherein the third counting signal is indicative of the predetermined minimum cycle number of the second clock signal being counted, and wherein the fourth counting signal is indicative of the predetermined maximum cycle number of the second clock signal being counted. The digital comparing circuit is configured to receive the first counting signal, the second counting signal, the third counting signal and the fourth counting signal, and further configured to compare the first counting signal, the second counting signal, the third counting signal and the fourth counting signal to generate a self-testing indication signal.

BRIEF DESCRIPTION OF THE DRAWINGS

Non-limiting and non-exhaustive embodiments are described with reference to the following drawings.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

The phrase "couple" includes direct connection and indirect connection. Indirect connection includes connection through conductor which has resistance and/or parasitic parameters such as inductance and capacitance, or connection through diode, and so on.

Figure 1:
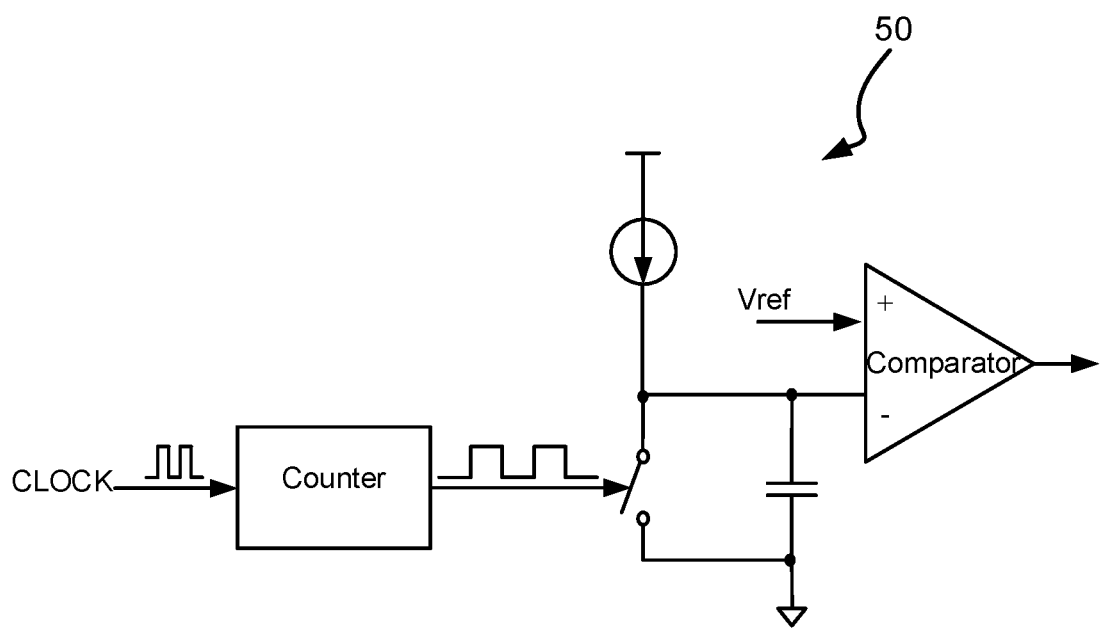
FIG. 1 schematically illustrates a conventional analog clock self-testing circuit 50.
Figure 2:
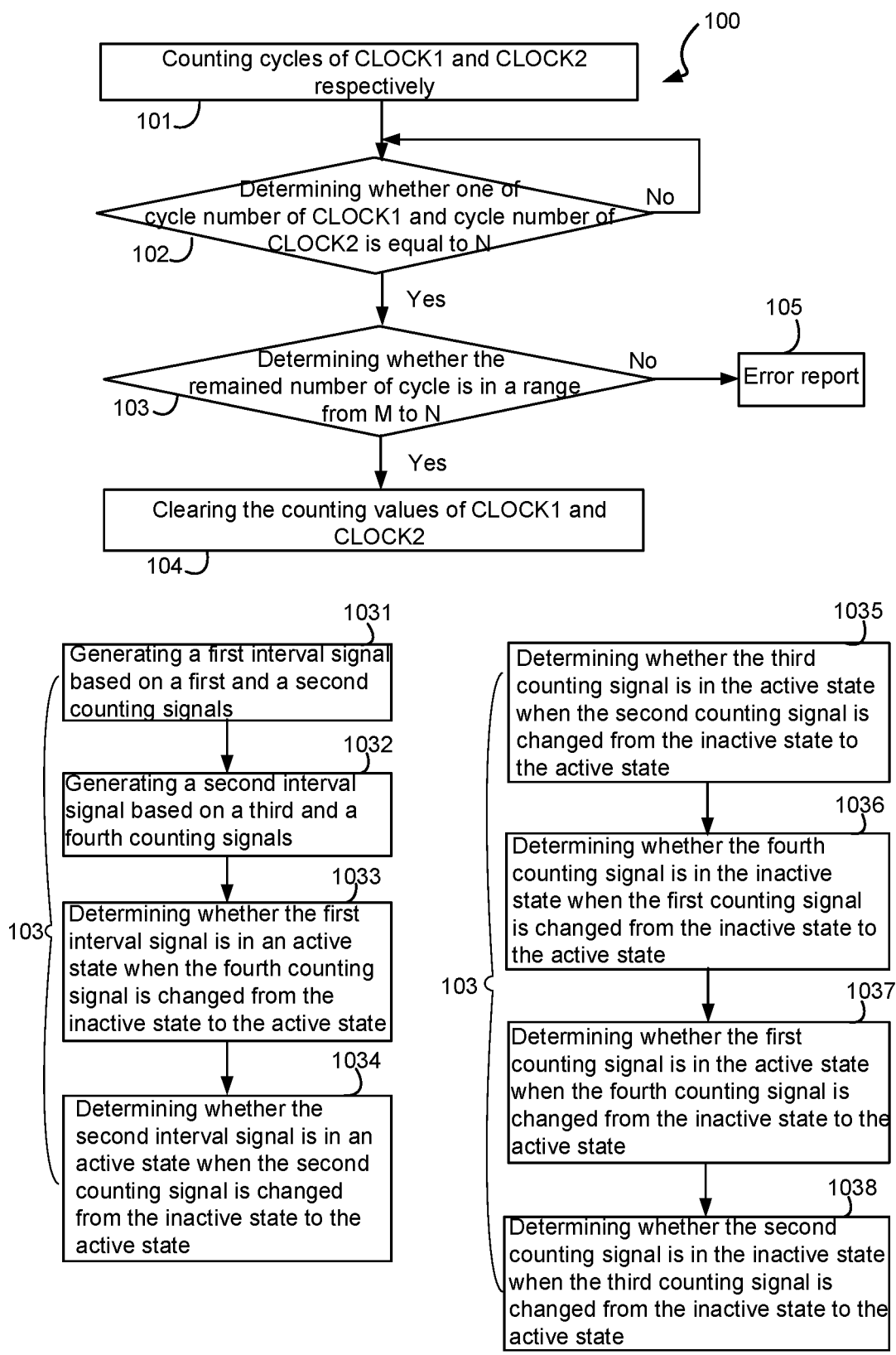
FIG. 2 illustrates a process flow of a clock self-testing method 100 for a clock signal in accordance with an embodiment of the present invention.

FIG. 2 illustrates a process flow of a clock self-testing method 100 for a clock signal in accordance with an embodiment of the present invention. In an embodiment, the clock self-testing method 100 may comprise a first clock signal CLOCK1 and a second clock signal CLOCK 2. Herein, the first clock signal CLOCK1 as a system clock signal to be tested may serve to control all synchronous logic operation and signal synchronization in a chip, and the second clock signal CLOCK2 may serve as a reference clock signal used to test the accuracy of the first clock signal CLOCK1. In an embodiment, frequency of the first clock signal CLOCK1 is the same as frequency of the second clock signal CLOCK 2. The clock self-testing method 100 may comprise steps 101-105.

In step 101, counting cycles of the first clock signal CLOCK1 and cycles of the second clock signal CLOCK2 respectively at the same moment. In an embodiment, counters are adopted to count cycles of the first clock signal CLOCK1 and cycles of the second clock signal CLOCK2. In an embodiment, counting cycles of the first clock signal CLOCK1 may comprise counting M cycles of the first clock signal CLOCK1 to generate a first counting signal, and counting N cycles of the first clock signal CLOCK1 to generate a second counting signal. Counting cycles of the second clock signal CLOCK2 may comprise counting M cycles of the second clock signal CLOCK2 to generate a third counting signal, and counting N cycles of the second clock signal CLOCK2 to generate a fourth counting signal. In an embodiment, the first counting signal, the second counting signal, the third counting signal and the fourth counting signal are logic signals having an active state (e.g., high logic state) and an inactive state (e.g., low logic state). Herein, M as a predetermined minimum cycle number is an integer greater than or equal to 1, and N as a predetermined maximum cycle number is an integer greater than M. One of ordinary skill in the art would understand that the value of N and M can be flexibly chosen depending on design specifications without departing from the scope of the present disclosure.

In step 102, determining whether one of the cycle number of the first clock signal CLOCK1 being counted and the cycle number of the second clock signal CLOCK2 being counted is equal to N. If the cycle number of the first clock signal CLOCK1 being counted or the cycle number of the second clock signal CLOCK2 being counted is equal to N, step 103 is performed. Otherwise, continuing with step 102.

In step 103, determining whether the remained one of the cycle number of the first clock signal CLOCK1 being counted and the cycle number of the second clock signal CLOCK2 being counted is in a count range from M to N. In an embodiment, the count range from M to N is indicative of an acceptable error range of the first clock signal CLOCK1 and the second clock signal CLOCK2. If so, step 104 is performed. Otherwise, turning to step 105. As can be understood, there may have many proposals to determine whether a cycle number of a clock signal being counted is in the count range from M to N without departing from the scope of the present disclosure.

In an exemplary embodiment, step 103 may comprise steps 1031-1034.

In step 1031, generating a first interval signal based on the first counting signal and the second counting signal. In an embodiment, generating the first interval signal based on the first counting signal and the second may comprise conducting XOR logic operation to the first counting signal and the second counting signal to generate the first interval signal. In an embodiment, the first interval signal indicates that the number of cycles of the first clock signal being counted in the count range from M to N. In an embodiment, the first interval signal is a logic signal having an active state (e.g., high logic state) and an inactive state (e.g., low logic state).

In step 1032, generating a second interval signal based on the third counting signal and the fourth counting signal. In an embodiment, generating a second interval signal based on the third counting signal and the fourth counting signal may comprise conducting XOR logic operation to the third counting signal and the fourth counting signal to generate the second interval signal. In an embodiment, the second interval signal indicates that the number of cycles of the first clock signal being counted is in the count range from M to N. In an embodiment, the second interval signal is a logic signal having an active state (e.g., high logic state) and an inactive state (e.g., low logic state).

In step 1033, determining whether the first interval signal is in the active state when the fourth counting signal is changed from the inactive state to the active state. In an embodiment, step 1033 may comprise determining whether the first interval signal is in the active state at rising edge of the fourth counting signal. For instance, if the first interval signal is in the active state at rising edge of fourth counting signal, the second clock signal CLOCK2 is correct.

In step 1034, determining whether the second interval signal is in the active state when the second counting signal is changed from the inactive state to the active state. In an embodiment, step 1034 may comprise determining whether the second interval signal is in the active state at rising edge of the second counting signal. For instance, if the second interval signal is in the active state at rising edge of the second counting signal, the first clock signal CLOCK1 is correct. It should be understood, in the exemplary embodiment of FIG. 2, step 1032 is illustrated behind of step 1031, and step 1034 is illustrated behind of step 1033. However, in actual operation applications, step 1031 and step 1032 may be happened simultaneously, and step 1033 and step 1034 may be happened simultaneously.

In other embodiments, step 103 may comprise steps 1035-1038.

In step 1035, determining whether the third counting signal is in the active state when the second counting signal is changed from the inactive state to the active state.

In step 1036, determining whether the fourth counting signal is in the active state when the first counting signal is changed from the inactive state to the active state.

In step 1037, determining whether the first counting signal is in the active state when the fourth counting signal is changed from the inactive state to the active state.

In step 1038, determining whether the second counting signal is in the inactive state when the third counting signal is changed from the inactive state to the active state.

In an embodiment, if the third counting signal is in the active state when the second counting signal is changed from the inactive state to the active state while the fourth counting signal is in the inactive state when the first counting signal is changed from the inactive state to the active state, the first clock signal CLOCK1 and the second clock signal CLOCK2 are correct. In other embodiments, if the first counting signal is in the active state when the fourth counting signal is changed from the inactive state to the active state while the second counting signal is in the inactive state when the third counting signal is changed from the inactive state to the active state, the first clock signal CLOCK1 and the second clock signal CLOCK2 are correct. It should also be understood, in the exemplary embodiment of FIG. 2, although steps 1037-1038 are illustrated behind of steps 1035-1036, in actual operation applications, step 1035 and step 1037 may be happened simultaneously.

In step 104, clearing the count value of the first clock signal CLOCK1 and the count value of the second clock signal CLOCK2 and preparing next counting period. That is, clearing the cycle number of the first clock signal CLOCK1 being counted and the cycle number of the second clock signal CLOCK2 being counted to zero. In an embodiment, clearing the count value of the first clock signal CLOCK1 and the count value of the second clock signal CLOCK2 may comprise resetting counters adopted to count cycles of the first clock signal CLOCK1 and cycles of the second clock signal CLOCK2.

It should be noted that the counters would overflow to restart a new counting period after the count values reach their respective overflow value. In an embodiment, the overflow values of the counters are greater than or equal to the predetermined maximum cycle number N. In an embodiment, the overflow value of these counters may be multiples of the predetermined maximum cycle number N.

In step 105, reporting error.

In some prior applications, only the accuracy of the system clock signal is detected such that the self-testing result may be incorrect if the reference clock signal itself is faulty. For example, in some applications, both the system clock signal and the reference clock signal occur errors, e.g., the frequency of the system clock signal is decreased while the frequency of the reference clock signal is increased. If the frequency of the reference clock signal is exactly multiple of that of the clock signal while the counter serving to count cycles of the reference clock signal may automatically reset to start a new round of counting after the count value reaches its overflow value, the cycle number of the system clock signal may still equal to that of the reference clock signal. In such an application, these errors can not be found out. In this invention, the clock self-testing method 100 can realize a cross-check between the system clock signal (e.g., the first clock signal CLOCK1) and the reference clock signal (e.g., the second clock signal CLOCK2). That is, no matter the system clock signal or the reference clock signal occurs error, the clock self-testing method 100 can detect the errors.

Figure 3:
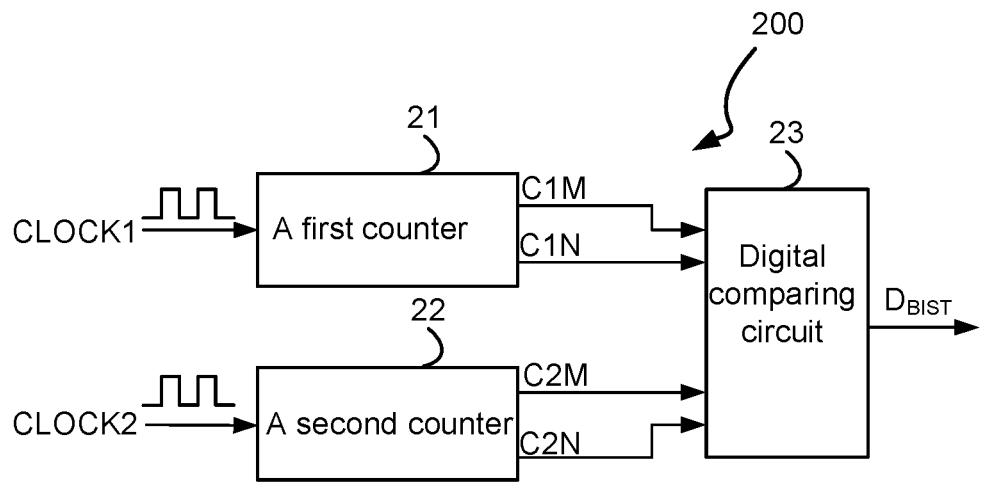
FIG. 3 illustrates a block diagram of a clock self-testing circuit 200 in accordance with an embodiment of the present invention.

FIG. 3 illustrates a block diagram of a clock self-testing circuit 200 in accordance with an embodiment of the present invention. As shown in FIG. 3, the clock self-testing circuit 200 may comprise a first counter 21, a second counter 22 and a digital comparing circuit 23.

The first counter 21 may be configured to receive the first clock signal CLOCK1 and further configured to count the first clock signal CLOCK1 to generate the first counting signal C1M and the second counting signal C1N. Herein, the first counting signal C1M represents M cycles of the first clock signal CLOCK1 being counted. The second counting signal C1N represents N cycles of the first clock signal CLOCK1 being counted. In an embodiment, the first counting signal C1M and the second counting signal C1N are logic signals having an active state (e.g., high logic state) and an inactive state (e.g., low logic state). In an embodiment, the logic state of the first counting signal C1M is changed from the inactive state to the active state when the cycle number of the first clock signal CLOCK1 being counted is equal to M. The logic state of the second counting signal C1N is changed from the inactive state to the active state when the cycle number of the first clock signal CLOCK1 being counted is equal to N.

The second counter 22 may be configured to receive the second clock signal CLOCK2 and further configured to count the second clock signal CLOCK2 to generate the third counting signal C2M and the fourth counting signal C2N. Herein, the third counting signal C2M represents M cycles of the second clock signal CLOCK2 being counted. The fourth counting signal C2N represents N cycles of the second clock signal CLOCK2 being counted. In an embodiment, the third counting signal C2M and the fourth counting signal C2N are logic signals having an active state (e.g., high logic state) and an inactive state (e.g., low logic state). In an embodiment, the logic state of the third counting signal C2M is changed from the inactive state to the active state when the cycle number of the second clock signal CLOCK2 being counted is equal to M. The logic state of the fourth counting signal C2N is changed from the inactive state to the active state when the cycle number of the second clock signal CLOCK2 being counted is equal to N.

The digital comparing circuit 23 may be configured to receive the first counting signal C1M, the second counting signal C1N, the third counting signal C2M and the fourth counting signal C2N, and further configured to compare the first counting signal C1M, the second counting signal C1N, the third counting signal C2M and the fourth counting signal C2N to generate a self-testing indication signal $D_{BIST}$. In an embodiment, self-testing indication signal $D_{BIST}$ is a logic signal having an active state (e.g., high logic state) and an inactive state (e.g., low logic state). In an embodiment, the active state of the self-testing indication signal $D_{BIST}$ represents that both the first clock signal CLOCK1 and the second clock signal CLOCK2 are correct, and the inactive state of the self-testing indication signal $D_{BIST}$ represents that both or one of the first clock signal CLOCK1 and the second clock signal CLOCK2 may occur error. In an embodiment, the digital comparing circuit may comprise a logic circuit consisting of multiple logic modules.

Figure 4:
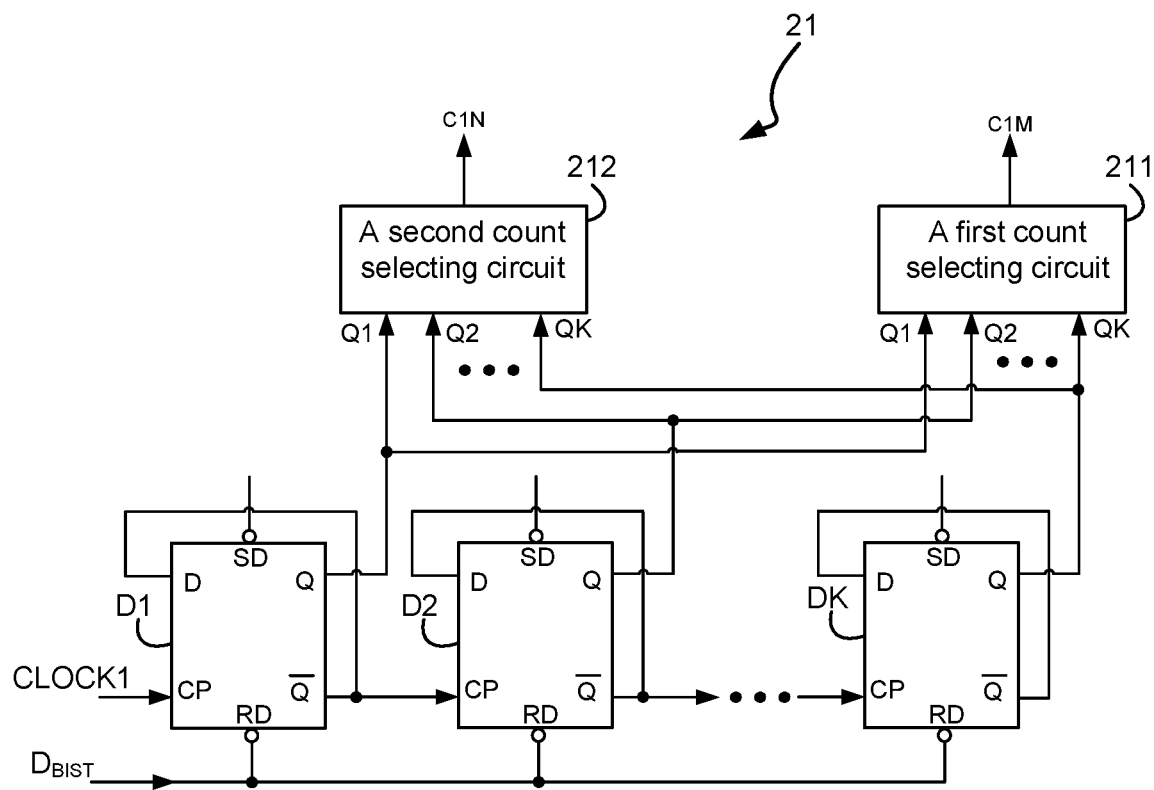
FIG. 4 schematically illustrates the first counter 21 of FIG. 3 in accordance with an embodiment of the present invention.

FIG. 4 schematically illustrates the first counter 21 of FIG. 3 in accordance with an embodiment of the present invention. In the embodiment shown in FIG. 4, the first counter 21 may comprise K edge-triggered flip-flops D1-DK, a first count selecting circuit 211 and a second count selecting circuit 212, where K is an integer and $2^K$ is greater than or equal to N. For example, if the predetermined maximum cycle number N is equal to sixty-four, K must be greater than or equal to six. If the predetermined maximum cycle number N is equal to one hundred, K must be greater than or equal to seven.

Each edge-triggered flip-flop has a data input terminal D, a trigger input terminal CP, a first output terminal Q, a second output terminal $\overline{Q}$, a set terminal SD, and a reset terminal RD. The data input terminal D of each edge-triggered flip-flop may be coupled to its second output terminal $\overline{Q}$. The set terminal SD of each edge-triggered flip-flop may be configured to receive a set signal to set an initial count value of the edge-triggered flip-flop. The reset terminal RD of each edge-triggered flip-flop may be configured to receive the self-testing indication signal $D_{BIST}$ to reset the edge-triggered flip-flop. The first output terminal Q of each edge-triggered flip-flop may be configured to provide a corresponding bit count signal (Q1, Q2, . . . or QK). In an embodiment, the plurality of bit count signals (Q1, Q2, . . . , and QK) are logic signals having an active state (e.g., high logic state) and an inactive state (e.g., low logic state). The trigger input terminal CP of the first edge-triggered flip-flop D1 may be configured to receive the first clock signal CLOCK1. The trigger input terminal CP of the second edge-triggered flip-flop D2 may be coupled to the second output terminal $\overline{Q}$ of the first edge-triggered flip-flop D1. The trigger input terminal CP of the third edge-triggered flip-flop D3 may be coupled to the second output terminal $\overline{Q}$ of the second edge-triggered flip-flop D2. And so forth.

The first count selecting circuit 211 may be configured to receive the plurality of bit count signals (Q1, Q2, QK), and further configured to choose and conduct a logic operation to the corresponding bit count signals in accordance with the predetermined minimum cycle number M to generate the first counting signal C1M.

The second count selecting circuit 212 may be configured to receive the plurality of bit count signals (Q1, Q2, QK), and further configured to choose and conduct a logic operation to the corresponding bit count signals according to the predetermined maximum cycle number N to generate the second counting signal C1N.

For example, if the predetermined maximum cycle number N is equal to sixty and the predetermined minimum cycle number M is equal to fifty-six, the minimum value of K is equal to six such that the first counter 21 may comprise six edge-triggered flip-flops D1-D6 each of which is configured to generate a corresponding bit count signal (Q1, Q2, . . . , or, Q6). The first count selecting circuit 211 may be configured to choose and conduct a logic operation to the fourth bit count signal Q4, the fifth bit count signal Q5 and the sixth bit count signal Q6 to generate the first counting signal C1M. In an embodiment, the first counting signal C1M is changed from the inactive state to the active state when all of the fourth bit count signal Q4, the fifth bit count signal Q5 and the sixth bit count signal Q6 are in the active states. In an embodiment, the active state of the first counting signal C1M is indicative of the cycle number of the first clock signal CLOCK1 is equal to the predetermined minimum cycle number M, i.e., fifty-six. The second count selecting circuit 212 may be configured to choose and conduct a logic operation to the third bit count signal Q3, the fourth bit count signal Q4, the fifth bit count signal Q5 and the sixth bit count signal Q6 to generate the second counting signal C1N. In an embodiment, the second counting signal C1N is changed from the inactive state to the active state when all of the third bit count signal Q3, the fourth bit count signal Q4, the fifth bit count signal Q5 and the sixth bit count signal Q6 are in the active state. In an embodiment, the active state of the second counting signal C1N is indicative of the cycle number of the first clock signal CLOCK1 is equal to the predetermined maximum cycle number N, i.e., sixty.

One of ordinary skill in the art would understand that the schematic diagram of the second counter 22 might be the same as that of the first counter 21 except that the second counter 22 may be configured to receive the second clock signal CLOCK2 at the trigger input terminal CP of the first edge-triggered flip-flop D1 to generate the third counting signal C2M and the fourth counting signal C2N. Here will not describe again for simplicity.

Figure 5:
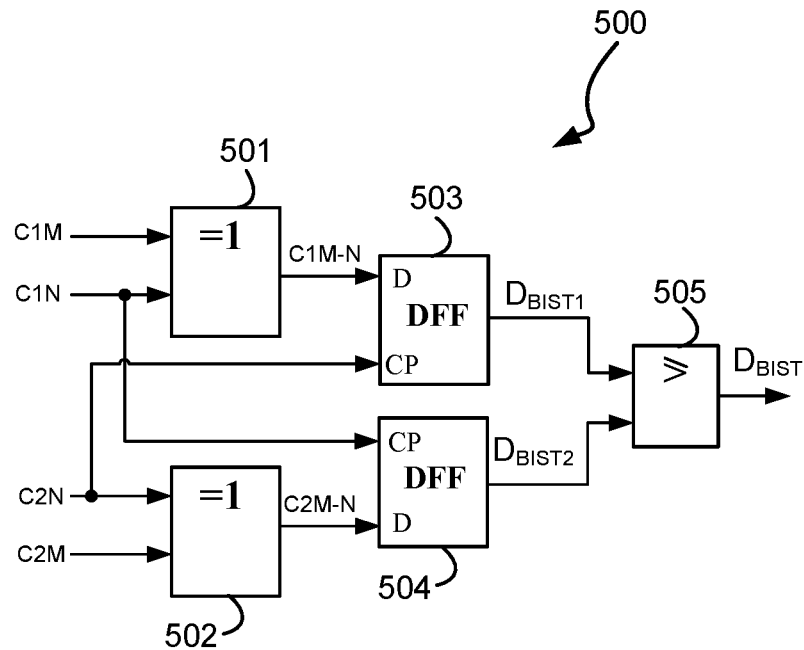
FIG. 5 schematically illustrates the digital comparing circuit of FIG. 4 in accordance with an embodiment of the present invention.

FIG. 5 schematically illustrates the digital comparing circuit of FIG. 4 in accordance with an embodiment of the present invention. As shown in FIG. 5, the digital comparing circuit 500 may comprise a first XOR logic gate 501, a second XOR logic gate 502, a first flip-flop 503 and a second flip-flop 504 and an OR logic gate 505.

The first XOR logic gate 501 may be configured to receive the first counting signal C1M and the second counting signal C1N, and further configured to conduct a logic XOR operation to the first counting signal C1M and the second counting signal C1N to generate the first interval signal C1M-N. In an embodiment, the first interval signal C1M-N is in the active state (e.g., high logic state) when the first counting signal C1M and the second counting signal C1N have different logic states.

The second XOR logic gate 502 may be configured to receive the third counting signal C2M and the fourth counting signal C2N, and further configured to conduct the logic XOR operation to the third counting signal C2M and the fourth counting signal C2N to generate the second interval signal C2M-N. In an embodiment, the second interval signal C2M-N is in the active state (e.g., high logic state) when the third counting signal C2M and the fourth counting signal C2N have different logic states.

The first flip-flop 503 may comprise a data input terminal D configured to receive the first interval signal C1M-N, a trigger input terminal CP configured to receive the fourth counting signal C2N, and an output terminal configured to provide a first self-testing indication signal $D_{BIST1}$. In an embodiment, the first flip-flop 503 may comprise a D flip-flop DFF with rising edge triggered. The logic states of the first self-testing indication signal $D_{BIST1}$ may follow these of the first interval signal C1M-N when the rising edge of the fourth counting signal C2N is arrived. In an embodiment, the logic high state of the first self-testing indication signal $D_{BIST1}$ may represent the cycle number of the second clock signal CLOCK2 is in the count range from M to N.

The second flip-flop 504 may comprise a data input terminal D configured to receive the second interval signal C2M-N, a trigger input terminal CP configured to receive the second counting signal C1N, and an output terminal configured to provide a second self-testing indication signal $D_{BIST2}$. In an embodiment, the second flip-flop 504 may comprise a D flip-flop DFF with rising edge triggered. The logic states of the first self-testing indication signal $D_{BIST2}$ may follow these of the second interval signal C2M-N when the rising edge of the second counting signal C1N is arrived. In an embodiment, the logic high state of the second self-testing indication signal $D_{BIST2}$ may represent the cycle number of the first clock signal CLOCK1 is in the count range from M to N.

The OR logic gate 505 may be configured to receive the first self-testing indication signal $D_{BIST1}$ and the second self-testing indication signal $D_{BIST2}$, and further configured to conduct a logic OR operation to the first self-testing indication signal $D_{BIST1}$ and the second self-testing indication signal $D_{BIST2}$ to generate the self-testing indication signal $D_{BIST}$. In an embodiment, the self-testing indication signal $D_{BIST}$ is logic high when either the first self-testing indication signal $D_{BIST1}$ or the second self-testing indication signal $D_{BIST2}$ is logic high. In an embodiment, the logic high state of the self-testing indication signal $D_{BIST}$ may represent both of the first clock signal CLOCK1 and the second clock signal CLOCK2 are accuracy.

Figure 6:
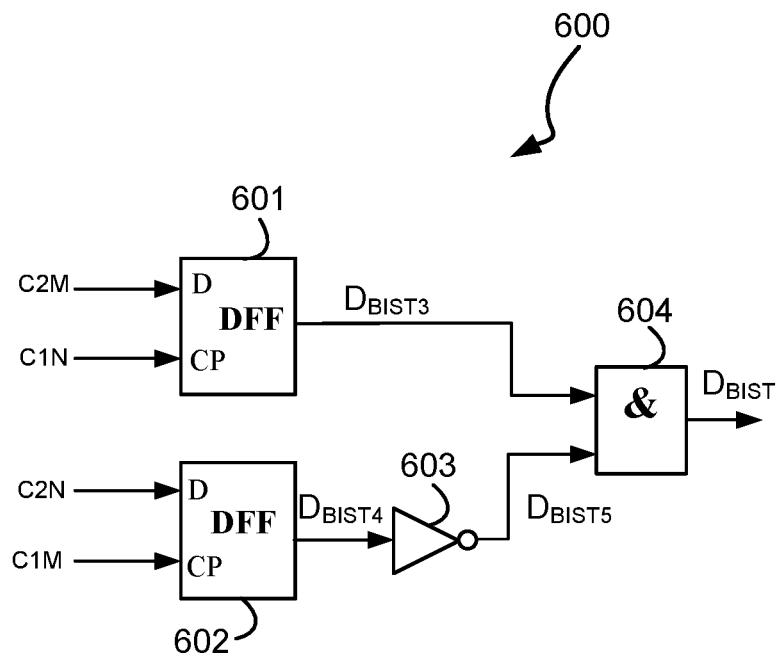
FIG. 6 schematically illustrates the digital comparing circuit of FIG. 4 in accordance with an embodiment of the present invention.

FIG. 6 schematically illustrates the digital comparing circuit of FIG. 4 in accordance with an embodiment of the present invention. As shown in FIG. 6, the digital comparing circuit 600 may comprise a third flip-flop 601, a fourth flip-flop 602, an inverter 603 and an AND logic gate 604.

The third flip-flop 601 may comprise a data input terminal D configured to receive the third counting signal C2M, a trigger input terminal CP configured to receive the second counting signal C1N, and an output terminal configured to provide a third self-testing indication signal $D_{BIST3}$. In an embodiment, the third flip-flop 601 may comprise a D flip-flop DFF with rising edge triggered. The logic states of the third self-testing indication signal $D_{BIST3}$ may follow these of the third counting signal C2M when the rising edge of the second counting signal C1N is arrived.

The fourth flip-flop 602 may comprise a data input terminal D configured to receive the fourth counting signal C2N, a trigger input terminal CP configured to receive the first counting signal C1M, and an output terminal configured to provide a fourth self-testing indication signal $D_{BIST4}$. In an embodiment, the fourth flip-flop 602 may comprise a D flip-flop DFF with rising edge triggered. The logic states of the fourth self-testing indication signal $D_{BIST4}$ may follow these of the fourth counting signal C2N when the rising edge of the first counting signal C1M is arrived.

The inverter 603 may be configured to receive the fourth self-testing indication signal $D_{BIST4}$, and further configured to conduct an inverting operation to the fourth self-testing indication signal $D_{BIST4}$ to generate a fifth self-testing indication signal $D_{BIST5}$.

The AND logic gate 604 may be configured to receive the third self-testing indication signal $D_{BIST3}$ and the fifth self-testing indication signal $D_{BIST5}$, and further configured to conduct a logic AND operation to the third self-testing indication signal $D_{BIST3}$ and the fifth self-testing indication signal $D_{BIST5}$ to generate the self-testing indication signal $D_{BIST}$. In an embodiment, the self-testing indication signal $D_{BIST}$ is logic high when both the third self-testing indication signal $D_{BIST3}$ and the fifth self-testing indication signal $D_{BIST5}$ are logic high. In an embodiment, the logic high state of the self-testing indication signal $D_{BIST}$ may represent both of the first clock signal CLOCK1 and the second clock signal CLOCK2 are accuracy. That is, if the third counting signal C2M is logic high when the rising edgy of the second counting signal C1N is arrived, while the fourth counting signal C2N is logic low when the rising edgy of the first counting signal C1M is arrived, both of the first clock signal CLOCK1 and the second clock signal CLOCK2 are accuracy.

Figure 7:
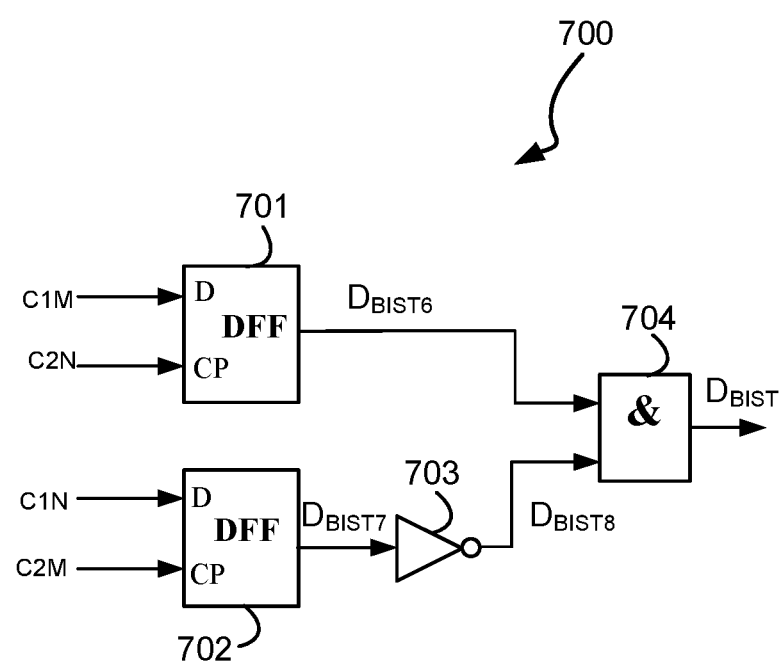
FIG. 7 schematically illustrates the digital comparing circuit of FIG. 4 in accordance with an embodiment of the present invention.

FIG. 7 schematically illustrates the digital comparing circuit of FIG. 4 in accordance with an embodiment of the present invention. As shown in FIG. 7, the digital comparing circuit 700 may comprise a fifth flip-flop 701, a sixth flip-flop 702, an inverter 703 and an AND logic gate 704.

The fifth flip-flop 701 may comprise a data input terminal D configured to receive the first counting signal C1M, a trigger input terminal CP configured to receive the fourth counting signal C2N, and an output terminal configured to provide a sixth self-testing indication signal $D_{BIST6}$. In an embodiment, the fifth flip-flop 701 may comprise a D flip-flop DFF with rising edge triggered. The logic states of the sixth self-testing indication signal $D_{BIST6}$ may follow these of the first counting signal C1M when the rising edge of the fourth counting signal C2N is arrived.

The sixth flip-flop 702 may comprise a data input terminal D configured to receive the second counting signal C1N, a trigger input terminal CP configured to receive the third counting signal C2M, and an output terminal configured to provide a seventh self-testing indication signal $D_{BIST7}$. In an embodiment, the sixth flip-flop 702 may comprise a D flip-flop DFF with rising edge triggered. The logic states of the seventh self-testing indication signal $D_{BIST7}$ may follow these of the second counting signal C1N when the rising edge of the third counting signal C2M is arrived.

The inverter 703 may be configured to receive the seventh self-testing indication signal $D_{BIST7}$, and further configured to conduct an inverting operation to the seventh self-testing indication signal $D_{BIST7}$ to generate an eighth self-testing indication signal $D_{BIST8}$.

The AND logic gate 704 may be configured to receive the sixth self-testing indication signal $D_{BIST6}$ and the eighth self-testing indication signal $D_{BIST8}$, and further configured to conduct a logic AND operation to the sixth self-testing indication signal $D_{BIST6}$ and the eighth self-testing indication signal $D_{BIST8}$ to generate the self-testing indication signal $D_{BIST}$. In an embodiment, the self-testing indication signal $D_{BIST}$ is logic high when both the sixth self-testing indication signal $D_{BIST6}$ and the eighth self-testing indication signal $D_{BIST8}$ are logic high. In an embodiment, the logic high state of the self-testing indication signal $D_{BIST}$ may represent both of the first clock signal CLOCK1 and the second clock signal CLOCK2 are accuracy. That is, if the first counting signal C1M is logic high when the rising edgy of the fourth counting signal C2N is arrived, while the second counting signal C1N is logic low when the rising edgy of the third counting signal C2M is arrived, both of the first clock signal CLOCK1 and the second clock signal CLOCK2 are accuracy.

Obviously many modifications and variations of the present invention are possible in light of the above teachings. It is therefore to be understood that within the scope of the appended claims the invention may be practiced otherwise than as specifically described. It should be understood, of course, the foregoing invention relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What I claim is:

1. A clock self-testing circuit, comprising:
   a first clock signal;
   a second clock signal, wherein frequency of the first clock signal is the same as frequency of the second clock signal;
   a first counter, configured to receive the first clock signal, and further configured to count cycles of the first clock signal to generate a first counting signal and a second counting signal, wherein the first counting signal is indicative of a predetermined minimum cycle number of cycles of the first clock signal being counted, and wherein the second counting signal is indicative of a predetermined maximum cycle number of cycles of the first clock signal being counted;
   a second counter, configured to receive the second clock signal, and further configured to count cycles of the second clock signal to generate a third counting signal and a fourth counting signal, wherein the third counting signal is indicative of the predetermined minimum cycle number of cycles of the second clock signal being counted, and wherein the fourth counting signal is indicative of the predetermined maximum cycle number of cycles of the second clock signal being counted; and
   a digital comparing circuit, configured to receive the first counting signal, the second counting signal, the third counting signal and the fourth counting signal, and further configured to compare the first counting signal, the second counting signal, the third counting signal and the fourth counting signal to generate a self-testing indication signal.

2. The clock self-testing circuit of claim 1, wherein the digital comparing circuit comprises:
   a first XOR logic gate, configured to receive the first counting signal and the second counting signal, and further configured to conduct a logic XOR operation to the first counting signal and the second counting signal to generate a first interval signal;
   a second XOR logic gate, configured to receive the third counting signal and the fourth counting signal, and further configured to conduct the logic XOR operation to the third counting signal and the fourth counting signal to generate a second interval signal;
   a first flip-flop, having a data input terminal configured to receive the first interval signal, a trigger input terminal configured to receive the fourth counting signal, and an output terminal configured to provide a first self-testing indication signal;
   a second flip-flop, having a data input terminal configured to receive the second interval signal, a trigger input terminal configured to receive the second counting signal, and an output terminal configured to provide a second self-testing indication signal; and
   an OR logic gate, configured to receive the first self-testing indication signal and the second self-testing indication signal, and further configured to conduct a logic OR operation to the first self-testing indication signal and the second self-testing indication signal to generate the self-testing indication signal.

3. The clock self-testing circuit of claim 1, wherein the digital comparing circuit comprises:
   a third flip-flop, having a data input terminal configured to receive the third counting signal, a trigger input terminal configured to receive the second counting signal, and an output terminal configured to provide a third self-testing indication signal;
   a fourth flip-flop, having a data input terminal configured to receive the fourth counting signal, a trigger input terminal configured to receive the first counting signal, and an output terminal configured to provide a fourth self-testing indication signal;
   an inverter, configured to conduct an inverting operation to the fourth self-testing indication signal to generate a fifth self-testing indication signal; and
   an AND logic gate, configured to receive the third self-testing indication signal and the fifth self-testing indication signal, and further configured to conduct a logic AND operation to the third self-testing indication signal and the fifth self-testing indication signal to generate the self-testing indication signal.

4. The clock self-testing circuit of claim 1, wherein the digital comparing circuit comprises:
   a fifth flip-flop, having a data input terminal configured to receive the first counting signal, a trigger input terminal configured to receive the fourth counting signal, and an output terminal configured to provide a sixth self-testing indication signal;
   a sixth flip-flop, having a data input terminal configured to receive the second counting signal, a trigger input terminal configured to receive the third counting signal, and an output terminal configured to provide a seventh self-testing indication signal;
   an inverter, configured to conduct an inverting operation to the seventh self-testing indication signal to generate an eighth self-testing indication signal; and
   an AND logic gate, configured to receive the sixth self-testing indication signal and the eighth self-testing indication signal, and further configured to conduct a logic AND operation to the sixth self-testing indication signal and the eighth self-testing indication signal to generate the self-testing indication signal.

5. The clock self-testing circuit of claim 1, wherein the self-testing indication signal is configured to indicate whether the first clock signal and the second clock signal are correct.

6. The clock self-testing circuit of claim 1, wherein a count range from the predetermined minimum cycle number to the predetermined maximum cycle number is indicative of an acceptable error range of the first clock signal and the second clock signal.

7. The clock self-testing method of claim 1, wherein the first clock signal is configured to control all synchronous logic operation in a chip, and the second clock signal is configured to serve as a reference clock signal to test the first clock signal.

* * * * *